United States Patent [19]

Mori et al.

[11] Patent Number: 4,806,987
[45] Date of Patent: Feb. 21, 1989

[54] PROJECTION-EXPOSING APPARATUS

[75] Inventors: Takashi Mori, Kawasaki; Koichi Matsumoto, Tokyo; Tsutomu Takai, Tokyo; Masaichi Murakami, Tokyo; Kyoichi Suwa, Yokohama, all of Japan

[73] Assignee: Nikon Corporation, Tokyo, Japan

[21] Appl. No.: 135,377

[22] Filed: Dec. 21, 1987

[30] Foreign Application Priority Data

Dec. 24, 1986 [JP] Japan ................................. 61-313853

[51] Int. Cl.⁴ ............................................ G03B 27/42
[52] U.S. Cl. .................................................... 355/53
[58] Field of Search ............................ 355/43, 53, 77

[56] References Cited

U.S. PATENT DOCUMENTS

| | | | |
|---|---|---|---|
| 4,197,004 | 4/1980 | Hurlbut | 355/53 |
| 4,397,543 | 8/1983 | Kolbe et al. | 355/53 X |
| 4,657,379 | 4/1987 | Suwa | 355/53 |
| 4,676,630 | 6/1987 | Matsushita et al. | 355/53 |
| 4,702,592 | 10/1987 | Geiger et al. | 355/53 |

OTHER PUBLICATIONS

B. M. Watrasiewics, Optica Acta, vol. 12, pp. 391–400, 1965.

Primary Examiner—Richard A. Wintercorn
Attorney, Agent, or Firm—Shapiro and Shapiro

[57] ABSTRACT

A projection-exposing apparatus comprises a projecting optical system for projecting an image of a reticle having a predetermined pattern onto a wafer, and a stage for causing a relative shifting movement between a position of the wafer and a position of the reticle. A first exposure is effected for projecting and exposing the reticle image pattern from the projection optical system in a first area on the wafer and then the stage is shifted by a predetermined amount to effect second exposure for projecting and exposing the reticle image pattern in a second area positioned adjacent to the first area on the wafer thereby the reticle image being projected and exposed onto different areas on the same wafer. The stage causes the relative shifting movement between the reticle and the wafer in such a manner that the reticle image pattern obtained by the first exposure and the reticle image pattern obtained by the second exposure are overlapped with each other on the wafer by a predetermined amount.

2 Claims, 11 Drawing Sheets

PROJECTION-EXPOSING APPARATUS

BACKGROUND OF THE INVENTION

The present invention relates to a projecting and exposing apparatus, and more particularly, it relates to a projection-exposing apparatus capable of obtaining a large exposure area by composing an image pattern.

Recently, projection-exposing apparatuses have been indipensable to the manufacture of integrated semiconductor elements such as VLST. Further, it has been required for correctly projecting and exposing more detailed or minute patterns onto a wider area to obtain higher integrated articles.

However, in general, since ability of a projection lens incorporated into the projection-exposing apparatus is determined by a wave length of exposing light, numerical aperture (N.A.) of the lens and an area to be exposed, it is extremely difficult to treat a wide area, while shortening the wave length and maintaining the high N.A. in order to obtain an excellent resolving power. For this reason, it has been proposed to compose a picture or image by shifting a wafer, which is an object to be exposed, by a predetermined amount before each exposing operation, and repeating a plurality of exposing operations by means of a projection lens having a high resolving power only in a relatively narrow area, thereby treating a wider area while maintaining the high resolving power.

However, on composing the image, there arose a problem that a pattern formed in each exposing operation was not registered or aligned with a pattern obtained in the previous exposing operation in a boundary area thereof due to minuteness of the patterns derived from high integration, thereby causing an incorrect connection between the two adjacent patterns in the boundary area, with the result that circuit elements and the like did not present their normal characteristics.

SUMMARY OF THE INVENTION

An object of the present invention is to provide a projection-exposing apparatus capable of composing a wide or large image by repeatedly projecting and exposing minute patterns onto a wide area with a high resolving power, wile maintaining a good connection between the patterns in a boundary area.

According to the present invention, there is provided a projection-exposing apparatus comprising a projecting optical system for projecting an image of a reticle having a predetermined pattern onto a wafer, and a stage for causing a relative shifting movement between a position of the wafer and a position of the reticle, in which a first exposure is effected for projecting and exposing the reticle image pattern from the projection optical system in a first area on the wafer and then the stage is shifted by a predetermined amount to effect second exposure for projecting and exposing the reticle image pattern in a second area positioned adjacent to the first area on the wafer thereby the reticle image being projected and exposed onto different areas on the same wafer. The stage causes the relative shifting movement between the reticle and the wafer in such a manner that the reticle image pattern obtained by the first exposure and the reticle image pattern obtained by the second exposure are overlapped with each other on the wafer by a predetermined amount.

More particularly, a width of the overlapped area of the reticle image patterns on the wafer includes a waveoptic amount $\Delta$ of overlap corresponding to twice a distance $\delta$ from a boundary of geometrical image to a position having light intensity corresponding to a half a value of a threshold for exposing a resist in a distribution of light intensity of the projected reticle image pattern.

With the construction mentioned above, in the present invention, since proper exposure is effected in a boundary area between the firs and second exposure areas by the light intensity having a value more than that of the threshold of the resist, patterns formed by an etching treatment after the exposure are uniformly connected even in the boundary area thereof, thereby connecting boundaries of the composed image smoothly.

In order to explain the above effect obtainable from the present invention, an example wherein when the first and second exposure areas on the wafer are exposed the reticle image patterns obtained on the wafer by the first exposure and the second exposure are not overlapped with each other but are contacted geometrically each other will now be explained.

Figure 2:
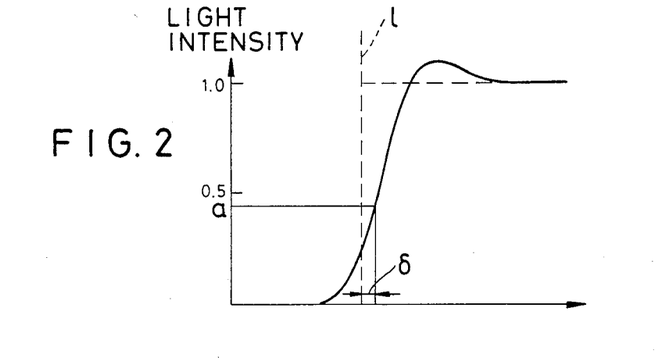
FIG. 2 is a graph showing a feature of light intensity of an image of a step pattern.

In general, a pattern positioned on a reticle comprises a desired pattern as a so-called step pattern formed by a transparent area and an opaque shading or shielding area. When such step pattern is projected onto a wafer by means of a projection-exposing apparatus, a distribution of light intensity will be, for example, as shown in FIG. 2. This distribution of the intensity varies in accordance with factors such as a wave length, of exposure light, numerical aperture (N.A.) of a projection lens and a so-called value associated with a feature of interference of illumination light; the distribution of the intensity is obtained by such factors.

Figure 3A:
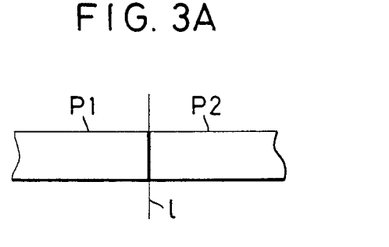
FIG. 3A is a view for explaining an example wherein first and second exposure operations of the step pattern are effected without an overlapped area.
Figure 3B:
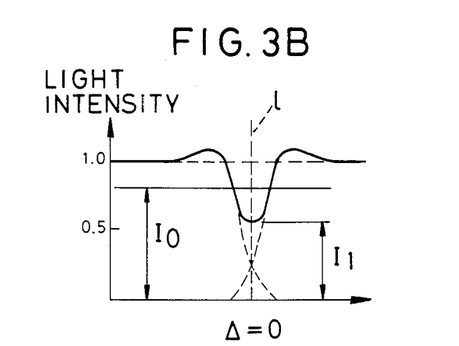
FIG. 3B is a graph showing a feature of distribution of light intensity in the example of FIG. 3A.

Accordingly, as shown in FIG. 3A, when the exposure operations are effected in such a manner that a reticle image pattern $P_1$ obtained on the first exposure area by the first exposure and a reticle image pattern $P_2$ obtained on the second exposure area adjacent to the first exposure area by the second exposure are geometrically contacted each other, the composed light intensity distribution will be as shown in FIG. 3B. More particularly when two patterns of the distribution of the light intensity as shown in FIG. 2 are symmetrically overlapped with the amount of overlap $\Delta = 0$, as shown by a solid line in FIG. 3B, the light intensity $I_1$ in a geometrical boundary becomes twice a value of the intensity of each pattern of the distribution at a position corresponding to an edge of the pattern; however, said light intensity $I_1$ does not each a value $I_0$ of a threshold required for exposing a resist. Thus, in this boundary the exposure for the resist will be insufficient, with the result that, if the resist is a negative one, the pattern cannot be formed on the resist, and, if the resist is a positive one, a resist layer cannot be removed from the positive portion; thus, in any case, there arises defect upon forming the pattern.

Figure 4A:
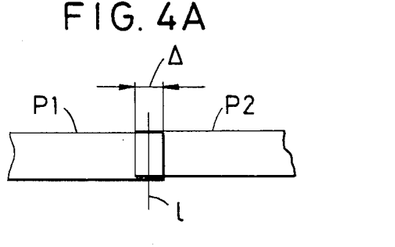
FIG. 4A is a view for explaining an example wherein first and second exposure operations of the step pattern are effected with an amount $\Delta$ of overlap.
Figure 4B:
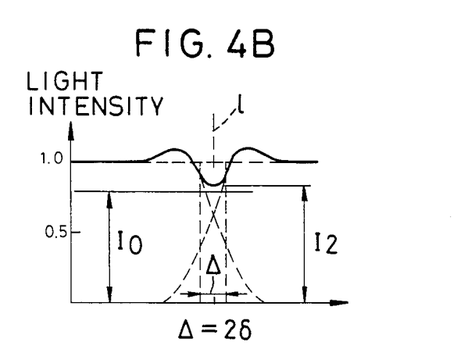
FIG. 4B is a graph showing a feature of distribution of light intensity in the example of FIG. 4A.

On the other hand, in the present invention, as shown in FIG. 4A, since the pattern $P_1$ obtained by the first exposure and the pattern $P_2$ (to be connected to the former) obtained by the second exposure are overlapped with each other by the predetermined amount $\Delta$ in width, as shown in FIG. 4B, the composed light intensity $I_2$ on a boundary line corresponding to a center of the overlapped portion of the patterns can be greater than the threshold value $I_0$ for exposing the resist. Therefore, the exposure in the boundary area is well sufficient, and, thus, a good connection between the patterns can be achieved by the exposure required for forming the patterns.

In the boundary area between the first exposed pattern P₁ and the second exposed pattern P₂, since the light intensity in the first exposure is combined with the light intensity in the second exposure, the light intensity on the boundary line 1 required for each exposure must have a value more than a half of the predetermined threshold value $I_0$. Accordingly, a necessary physical-optical amount of overlap between the patterns can be obtained as a value twice a distance $\delta$ between the geometrical and optical boundary line 1 and a position in which a light intensity of one of the exposing image patterns corresponds to a half a value of the threshold $I_0$ of the resist.

Here, according to Fourier focusing theory, when transmittivity of amplitude of an object is $A(u)$, distribution of amplitude $a(x)$ on an incidence pupil of a projection lens is given by the following equation:

$$a(x) = \int_{-\infty}^{\infty} A(u) \exp[-2\pi\, iux]dx$$

When a function of pupil is $f(x_0)$, distribution of amplitude $a'(x_0)$ on an exit pupil of the projection lens is given by the following equation:

$$a'(x_0) = a(x_0 - x)\, f(x_0)$$

Further, distribution of amplitude $A'(u')$ of an image will be:

$$A'(u') = \int_{-\infty}^{\infty} a'(x_0) \exp[-2\pi\, iu'x_0]dx$$

When distribution of intensity of an equivalent light source is $\gamma(x)$, distribution of intensity $I(u')$ of the image is given as follows:

$$I(u') = \int_A \gamma(x)\, |A'(u')|^2 dx$$

An integration area A is an expanse of the equivalent light source, and a ratio of this integration area to the entrance pupil is corresponds to a $\sigma$ value.

$$A(u) = \begin{cases} 0 & u < 0 \\ 1 & u \geq 0 \end{cases} \quad (1)$$

A numerical calculation regarding a common step pattern indicated by the above expression (1) as a mask for manufacturing an integrated circuit is effected, for example, by "Theoretical Calculation of Image of Straight Edges in Partially Coherent Illumination" (Optica Acta 1965, vol. 12, P. 391) by Mr. B. M. Watrasiewics.

According to the above calculation, for example, the distribution of the light intensity of the image is calculated when the exposure wave length $\lambda$ is 435.8 nm, numerical aperture (N.A.) of the projection lens is 0.4 and the $\sigma$ value is 0.5; here, if the threshold value of the resist is 0.8, the distance $\delta$ between the geometrical and optical boundary line 1 and a position having the light intensity corresponding to a half (i.e. 0.4) of the threshold value will be 0.072 $\mu$m. Thus, the necessary physical-optical amount $\Delta$ of overlap of the patterns will be ($\Delta = 2\delta =$) 0.14 $\mu$m.

DETAILED DESCRIPTION OF THE PREFERRED EMBODIMENT

The present invention will now be explained with reference to the illustrated embodiment.

Figure 1:
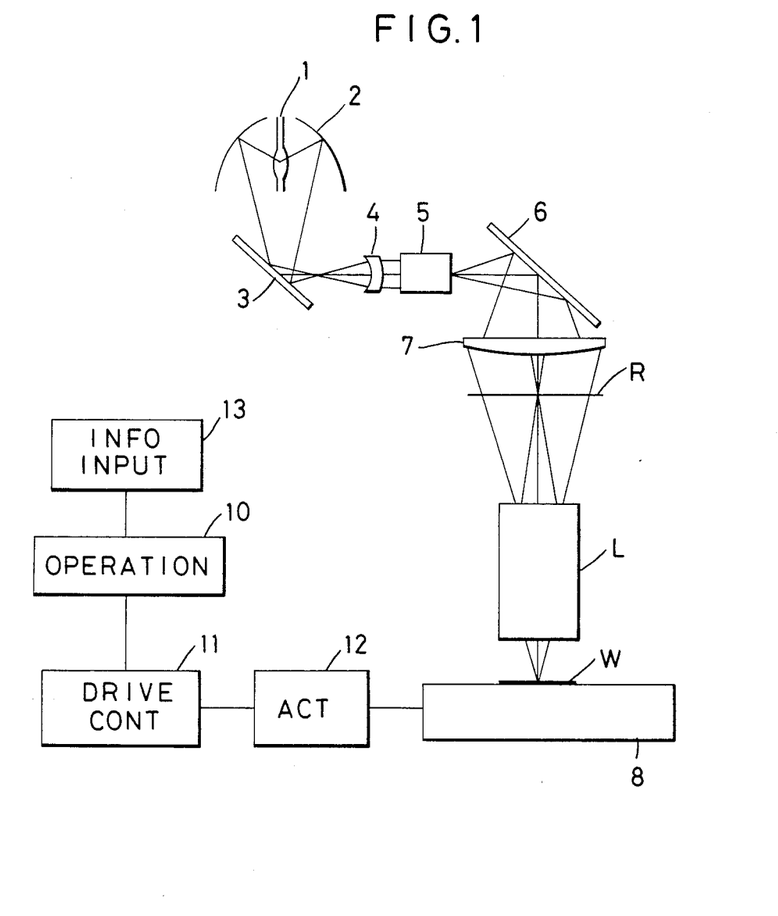
FIG. 1 is a schematic constructional view showing a whole construction of a projection-exposing apparatus according to the present invention.

FIG. 1 shows a schematic construction of a projection-exposing apparatus according to an embodiment of the present invention. A flux of exposure light beams emitted from a light source 1 such as a mercury lamp and the like is gathered together in a predetermined position by means of an elliptical mirror 2 and a reflection mirror 3, converted to parallel light beams through a collimater lens 4 and then formed as a substantial plane light source by means of an optical integrator 5. Light from the plane light source illuminates a reticle R uniformly through a reflection mirror 6 and a condenser lens system 7. A predetermined pattern on the reticle R is projected on a wafer W through a projection lens L, thereby exposing a pattern image from the reticle R on a resist coated on the wafer W. Upon completion of a first exposure operation, the wafer W is shifted, by driving a stage 8 on which the wafer W is rested, by a predetermined amount to a next exposing position for preparation of a next exposure operation. After a plurality of such exposure operations are repeated on the same wafer, a desired pattern corresponding to the reticle pattern can be transferred on the wafer by developing and etching the wafer.

Operation means 10 for performing an operation of an amount of shift of the stage 8 and accordingly an amount of shift of the wafer required for composition of a large image by repeating the exposure operations of the reticle pattern on the same wafer, a drive controller 11 for controlling the amount of shift of the stage by means of signals from the operation means 10, and stage activating means 12 for activating the stage 8 are provided. Further, input means 13 are also provided for inputting information required for operating an optimum amount Δ of overlap or superimposition of each of the exposed patterns to obtain the composed image. The operation means 10 calculates a proper value of the amount Δ of overlap of each of the projected patterns obtained by the first and second exposure operations on the basis of data such as exposure wave length λ supplied from the input means 13, numerical aperture (N.A.) of the projection lens L and a value σ as a condition of illumination, and calculates the amount of shift of the stage 8 required for overlapping the patterns.

Figure 5A:
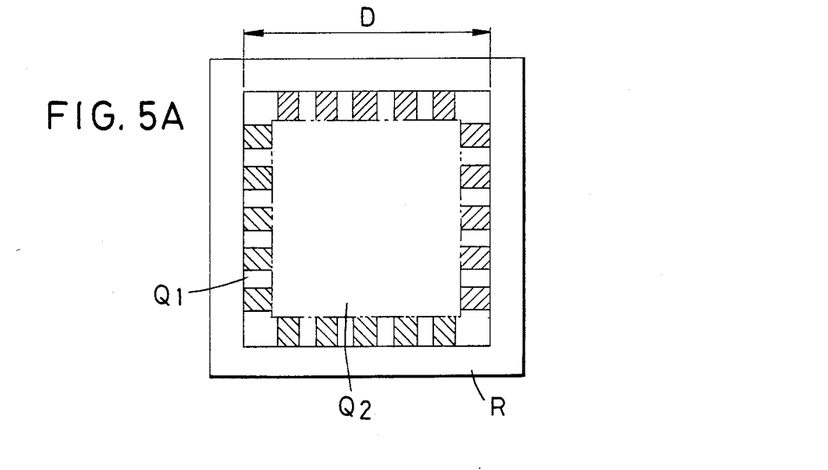
FIG. 5A is a plan view of a reticle used with an embodiment of the projection-exposing apparatus according to the present invention.
Figure 5B:
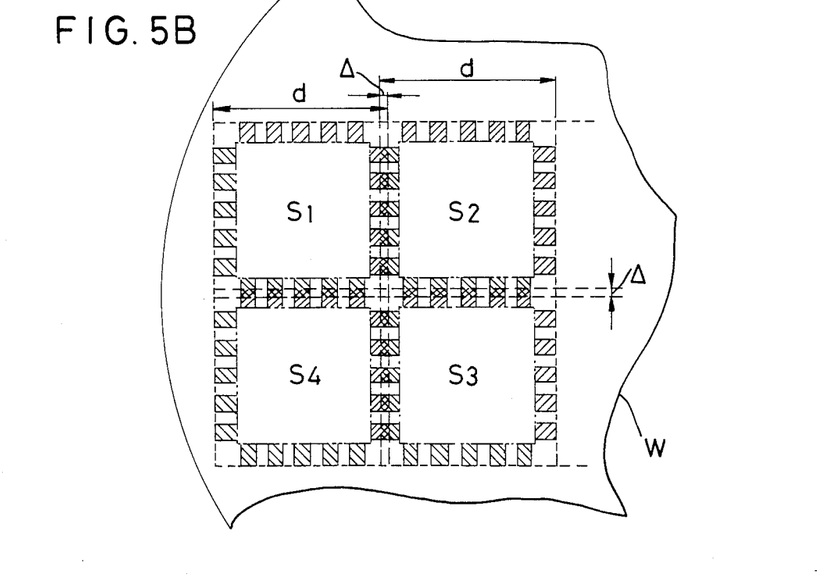
FIG. 5B is a plan view of areas of a wafer exposed by the reticle of FIG. 5A.

FIG. 5A is a plan view of the reticle R having a predetermined exposure pattern. The reticle R has a peripheral connecting portion $Q_1$ for being connected to adjacent exposure patterns to compose the image, and a central portion $Q_2$. The image on the reticle R is projected onto the wafer W by means of the projection L. By shifting the stage 8 by a predetermined amount, as shown in FIG. 5B, the first exposure (exposure in the first exposure operation) regarding a first area $S_1$, the second exposure regarding a second area $S_2$ positioned at a right side of the first area, the third exposure regarding a third area $S_3$ positioned below the second area, and the fourth exposure regarding a fourth area $S_4$ positioned at a left side of the third area are successively effected. By repeating such exposure operations, the four adjacent areas can be wholly exposed to obtain a large pattern as a whole.

Now, the amount of shift of the wafer required for performing the second exposure subsequently to the first exposure, and accordingly, the amount of shift of the stage 8 is determined by a value V explained hereinbelow. The value V is obtained from the following equation:

$$V = d - \Delta$$

Here, d is a length of the exposure pattern area on the wafer W, and Δ is a physical-optical amount of overlap required for effectively maintaining the connection between boundary portions of the exposed areas.

When a length of an effective pattern is D and reduction magnification of the projection lens L is β, the following equation is obtained:

$$d = D/\beta$$

Thus, the amount V of shift of the stage is obtained by the following equation including D (the length of the effective pattern) and β (the reduction magnification of the projection lens):

$$V = D/\beta - \Delta$$

If each of the reticle pattern areas is a square configuration as shown in FIG. 5A the amount of shift of the wafer W in right and left directions will be the same as that in upward and downward directions. However, it should be noted that if each pattern area on the reticle is rectangular, the amount of shift of the state in right and left directions differs from that in upward and downward directions. However, it should also be noted that the physical-optical amount Δ of overlap for effectively maintaining the connection between the boundary portion of the patterns is substantially the same in either direction.

Figure 6A:
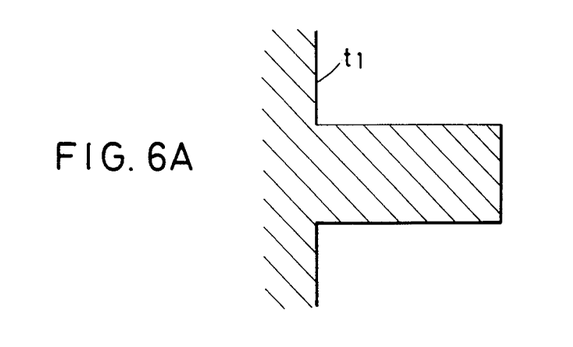
FIG. 6A is a partial plan view of a first exposed pattern in the embodiment.
Figure 6B:
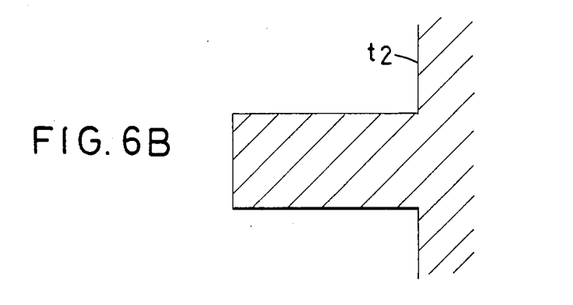
FIG. 6B is a partial plan view of a second exposed pattern in the embodiment.
Figure 7:
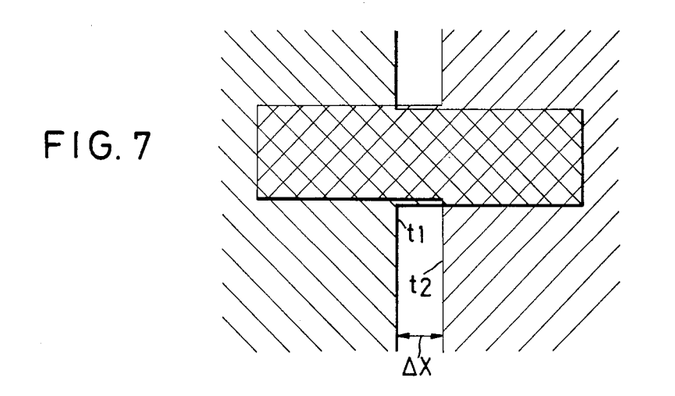
FIG. 7 is a plan view showing an overlapping relationship between the first and second exposed patterns in the embodiment.

Here, as a concrete example, it is assumed that straight step patterns having a width of line of 2 μm are connected in the first and second exposure operations. In this case, it is further assumed that the pattern for this straight line, which is projected in the first exposure is projected onto the wafer a a pattern shown in FIG. 6A, and the pattern in the second exposure is projected onto the wafer as a pattern shown in FIG. 6B. In FIGS. 6A and 6B, hatched areas show shading or shielded areas. Further, it is assumed that the pattern areas are exposed to overlap their boundary portions $t_1$ and $t_2$ together by a predetermined amount Δx, as shown in FIG. 7 and that, here, for simplicity sake, there is no transverse deviation Δy of the patterns.

Figure 8A:
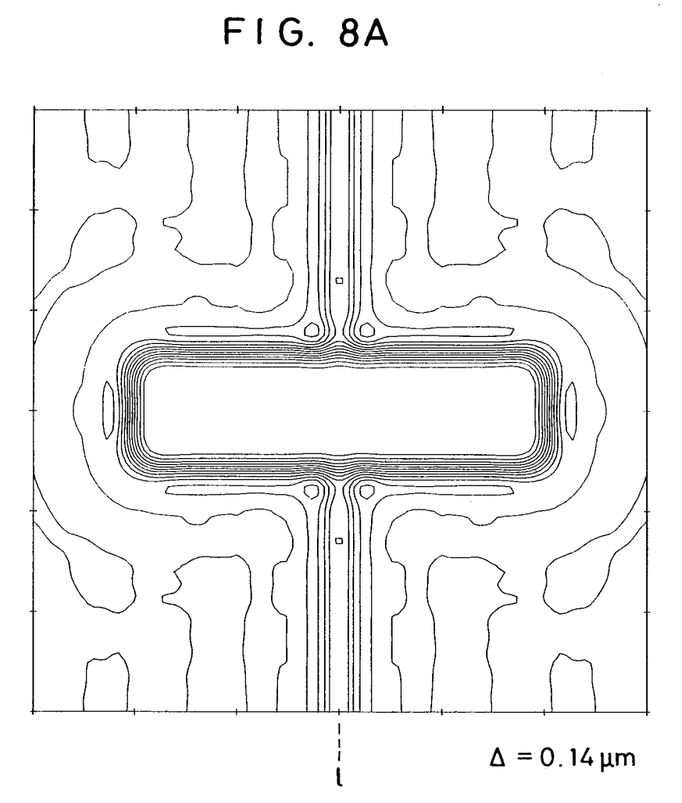
FIGS. 8A and 8B are contour-line view and cubic view of distribution of light intensity, respectively, showing the result of simulation of distribution of composed intensity of the exposure light in a first example.
Figure 8B:
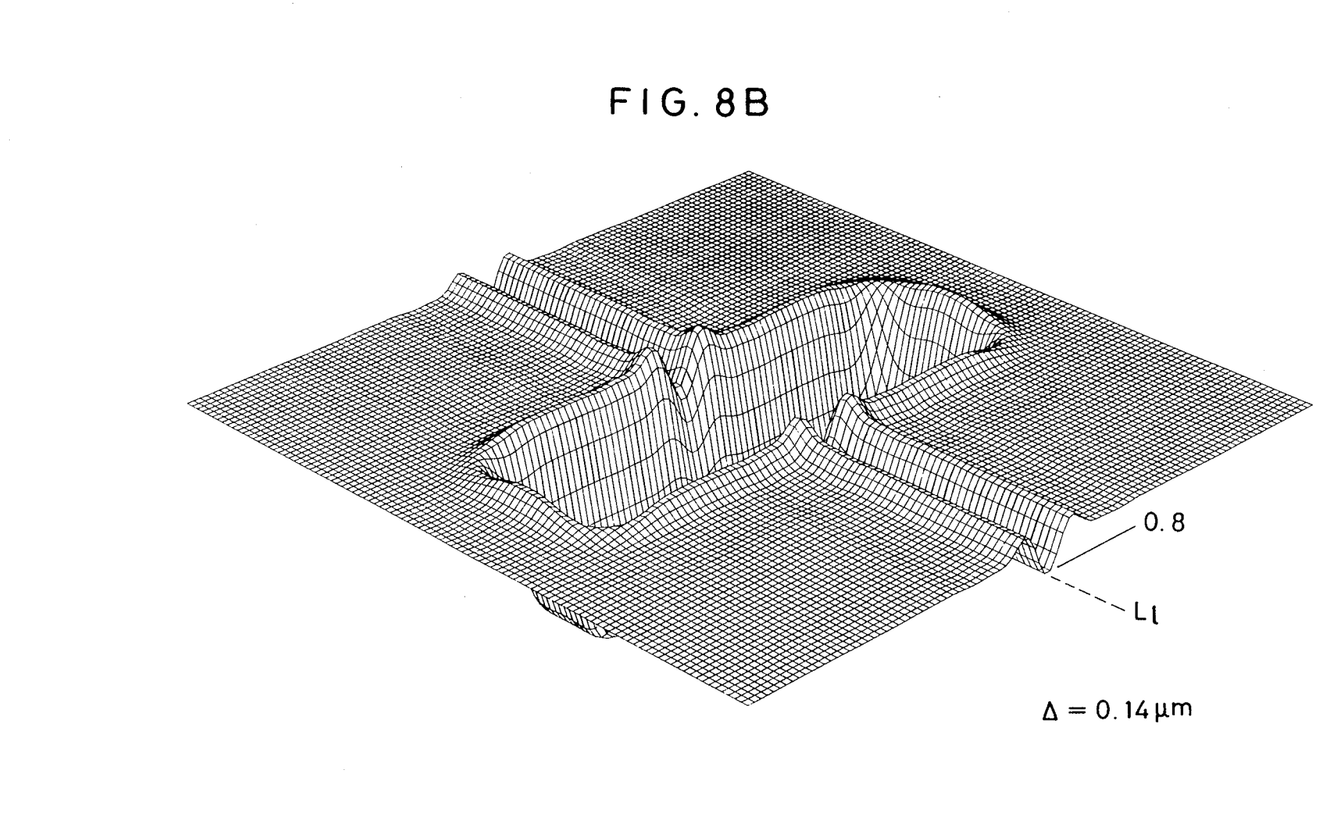

In such first and second exposure operations, results of simulations of distribution of intensity of the exposure light beams composed in the boundary areas are shown in FIGS. 8A, 8B, 9A, 9B, 10A and 10B. These simulations were effected under the condition wherein the exposure wave length λ was 435.8 nm, numerical aperture (N.A.) of the projection lens was 0.4 and the value σ as the condition of illumination was 0.5. FIG. 8A shows a contour-line view in the case where the exposure is effected with Δ=0.14 μm, which Δ is the physical-optical amount of overlap required for the first exposure and the second exposure obtained by the aforementioned equations. FIG. 8B is a view showing the result of simulation shown in FIG. 8A as a three-dimensional distribution of light intensity.

Figure 9A:
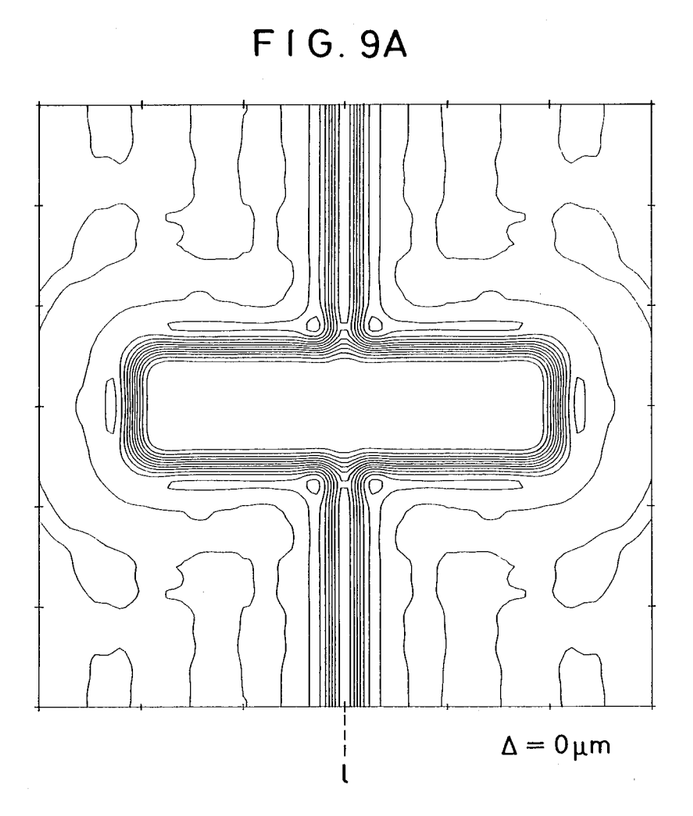
FIGS. 9A and 9B are views similar to those of FIGS. 8A and 8B, but in a second example.
Figure 9B:
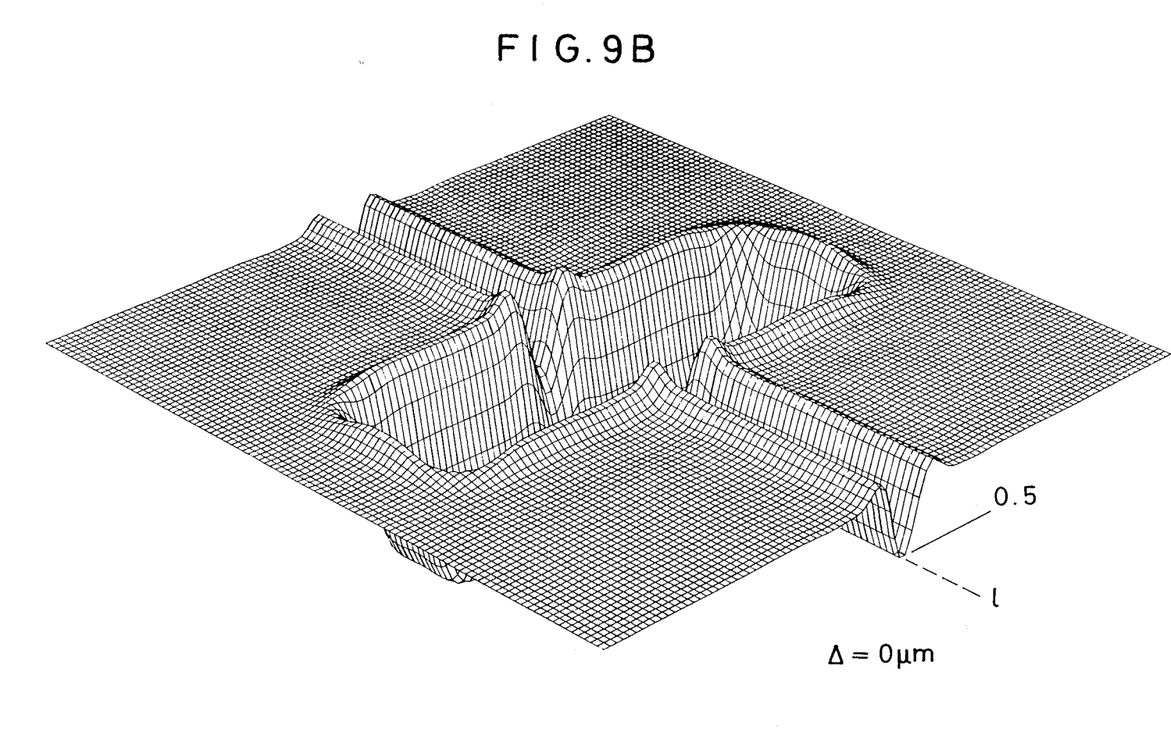

On the other hand, FIGS. 9A and 9B show a contour-line view and a three dimensional view of the distribution of intensity, respectively, similar to those of FIGS. 8A and 8B, however, in this case, the amount Δ is zero to contact geometrically the first exposed pattern with the second exposed pattern.

As can be understood from the results of these simulations, in the case of Δ=0.14 μm (FIGS. 8A and 8B), the intensity on a boundary line 1 between the first and second exposure patterns is 0.8, which reaches a threshold value of the resist; however, in the case of Δ=0 (FIGS. 9A and 9B), such intensity is 0.5, which does not reach the threshold value of the resist. In this case, proper exposure cannot be obtained on the boundary line, with the result that a normal pattern cannot be formed.

Figure 10A:
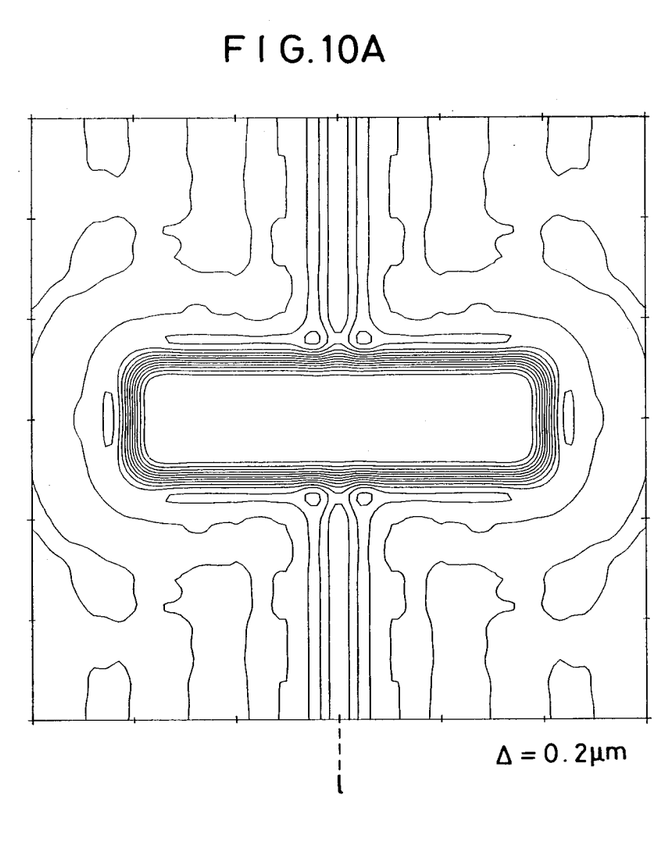
FIGS. 10A and 10B are views similar to those of FIGS. 8A and 8B, but in a third example.
Figure 10B:
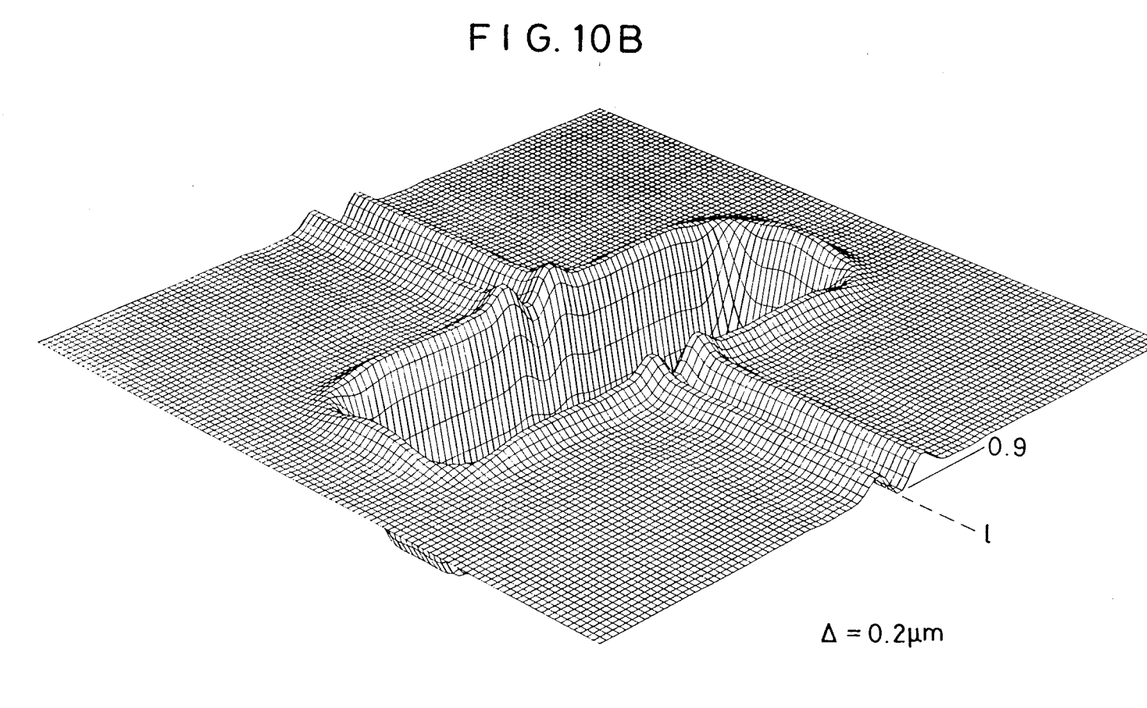

FIGS. 10A and 10B show the result of simulation in the case where the amount Δ of overlap between the first and second exposed patterns is 0.2 μm. Similar to the above, FIG. 10A is a contour-line view of the distribution of intensity, and FIG. 10B shows a three dimensional view of the distribution of intensity. In this case, the intensity on the boundary line 1 becomes 0.9, which completely reaches the threshold value for exposing the resist, and it is clear that there is uniform distribution of light intensity on the boundary area. It should be understood that a distance between adjacent graduations corresponds to 2 μm in FIGS. 8A, 9A and 10A.

As described above, according to the present invention, the projected images corresponding to each of the reticle patterns are overlapped in such a manner that the intensity of the composed light beams in the overlapped area between the first and second exposed patterns exceeds the threshold value of the resist. However, in an actual apparatus, since there is a mechanical error in alignment between the reticle and the wafer, in order to obtain the stable physical-optical amount Δ of overlap, it is desirable to determine an actual amount of overlap between the projected patterns on the basis of such mechanical alignment error derived from preciseness in alignment in the projection exposing apparatus, as well as the above-mentioned physical-optical amount Δ of overlap.

In the above example, the simulations were effected under the condition wherein the exposure wave length λ was 435.8 nm and numerical aperture (N.A.) of the projection lens was 0.4. However, since if the value σ as the condition of illumination is constant the physical-optical amount Δ of overlap is proportional to the wave length λ and is inversely proportional to the numerical aperture (N.A.), the results of the simulations explained and illustrated in the above example can be used to show other characteristics by changing the unit of the graduations in the drawings. For example, when the exposure wave length λ is 365 nm and numerical aperture (N.A.) of the projection lens is 0.6, the minimum required amount Δ of overlap will be 0.08 μm; in this case, in FIGS. 8A, 9A and 10A, when the distance between the adjacent graduations is 1.12 μm, the results of the simulations regarding the pattern having the line width of 1.12 μm will be obtained.

Figure 11:
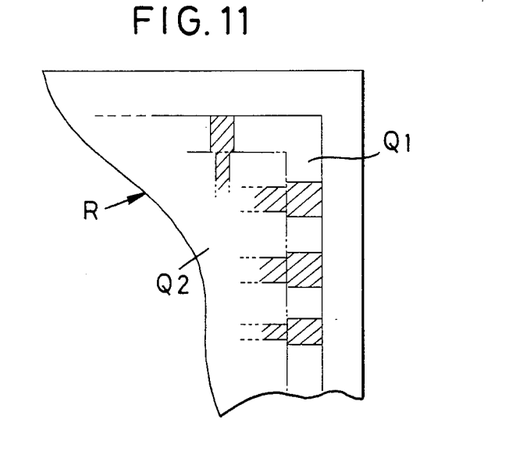
FIG. 11 is a partial plan view showing a boundary portion on the reticle.
Figure 12:
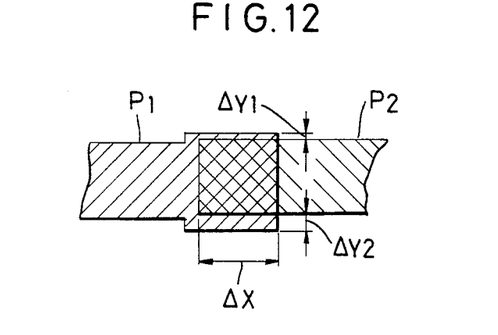
FIG. 12 is a plan view showing a relationship between the exposed patterns when there is a transverse deviation.

In the above example of the simulations, it was assumed that there was no transverse deviation Δy of the pattern; however, actually, as stated above, since there is the mechanical alignment error derived from preciseness in alignment in the projection exposing apparatus, such alignment error inevitably leads to the transverse deviation of the pattern. Thus, in order to maintain the effective connection between the adjacent patterns, it is desirable to enlarge a width of the pattern in a direction perpendicular to the boundary line between the patterns by an amount of the alignment error. More particularly, as shown in FIG. 11, in an overlapped area Δ in the connecting portion Q of the pattern on the reticle, it is desirable to enlarge the width of the pattern in the direction perpendicular to the boundary line by the amount of the alignment error. In this case, as shown in FIG. 12, for example, if the width in the direction perpendicular to the boundary line of a pattern image in the first exposure is Y₀, the projected pattern on the wafer has, at least in the overlapped area Δ, a width enlarged by $\Delta Y_1 + \Delta Y_2$ corresponding to the amount of the alignment error. With such construction, the second exposed pattern image $P_2$ will be overlapped against the first exposed pattern image $P_1$ without fail, thus permitting the effective connection between the patterns even if there is the transverse deviation due to the alignment error in the boundary area.

Accordingly, in the present invention, it is constructed that the pattern on the reticle corresponding to the pattern positioned in the overlapped area of the reticle pattern image on the wafer has, in a direction parallel to the boundary line between the first and second exposure areas, an enlarged width larger than those of the patterns positioned out of said overlapped area by at least the amount of the alignment error. In this case, although it is enough that one of the first and second exposure patterns to be overlapped has such enlarged width, both of the patterns may have the respective enlarged widths.

Further, with respect to a predetermined width given as a difference, in a direction parallel to the boundary line, between the pattern width in the central portion of the reticle corresponding to the portions of the reticle image other than the overlapped area and the pattern width in the peripheral connecting portion $Q_1$ of the reticle corresponding to the overlapped area of the reticle image, it is effective to adjust the pattern width previously in such a way as to prevent the possible "constriction" of the connected pattern which may be formed according to conditions of the distribution of the intensity of the composed light beams in the boundary area as well as the above-mentioned alignment error and to include a predetermined wave optic width for maintaining the pattern width constant.

In the embodiment described above, although it was explained that the pattern on the reticle was projected onto the adjacent areas on the wafer, it should be noted that, in the present invention, it is possible to obtain a large image on the wafer by providing a plurality of patterns on the same reticle and by successively projecting the respective reticle patterns onto the adjacent areas on the wafer. Further, when the second exposure is effected on the area adjacent to the first exposed area on the wafer, it is also possible to shift the reticle with respect to the wafer, in place of the shifting of the wafer by means of the stage.

According to the projection-exposing apparatus of the present invention, when a large image is composed by repeating the projection and exposure of the small patterns, it is possible to maintain the effective connection of the patterns in the boundary area of the image.

Accordingly, it is possible to obtain a large pattern image by projection-exposing in a more wide area by means of a projecting optical system having a considerably excellent resolving power in a relatively narrow area, and, thus, to satisfy the requirements which are contrary to each other (i.e., to achieve minuteness and to obtain a large image).

What is claimed is:

1. A projection exposing apparatus comprising a projecting optical system for projecting an image of a reticle having a predetermined pattern onto a wafer, and a stage for causing a relative shifting movement between a position of the wafer and a position of the reticle, and capable of effecting a first exposure for projecting and exposing the pattern image of the reticle from said projecting optical system in a first area on said wafer, and a second exposure for projecting and exposing the pattern image of the reticle in a second area adjacent to said first area upon shifting said stage by a predetermined amount, characterized in that:

said stage causes the relative shifting movement between said reticle and said wafer in such a manner that the pattern image of the reticle in said first exposure and the pattern image of the reticle in said second exposure are overlapped with each other on said wafer by a predetermined amount.

2. An apparatus according to claim 1, characterized in that a width of an overlapped area of said pattern images in said first exposure and in said second exposure on the wafer includes a wave-optic amount of overlap corresponding to twice a distance δ from a boundary of geometrical image to a position having light intensity corresponding to a half a value of a threshold for exposing a resist in a distribution of light intensity of the projected pattern image of the reticle.

* * * * *